United States Patent [19]

Usui

[11] Patent Number: 5,513,765
[45] Date of Patent: May 7, 1996

[54] PLASMA GENERATING APPARATUS AND METHOD

[75] Inventor: Kaoru Usui, Kawasaki, Japan

[73] Assignee: Fujitsu Limited, Kawasaki, Japan

[21] Appl. No.: 291,867

[22] Filed: Aug. 17, 1994

[30] Foreign Application Priority Data

Dec. 8, 1993 [JP] Japan ..................... 5-307908

[51] Int. Cl.⁶ .................................... H05H 1/00
[52] U.S. Cl. .............. 216/68; 216/71; 156/345; 118/723 MP; 118/723 E; 118/723 I
[58] Field of Search .................... 156/643, 345; 204/298.06, 298.08, 298.34, 192.12, 192.32; 118/723 MP, 723 I, 723 E

[56] References Cited

U.S. PATENT DOCUMENTS

| | | | |
|---|---|---|---|
| 4,371,412 | 2/1983 | Nishizawa | 156/345 |
| 4,844,775 | 7/1989 | Keeble | 156/643 |
| 4,948,458 | 8/1990 | Ogle | 156/643 |
| 5,234,529 | 8/1993 | Johnson | 156/345 |
| 5,241,245 | 8/1993 | Barnes et al. | 156/643 X |
| 5,277,751 | 1/1994 | Ogle | 156/643 |
| 5,304,282 | 4/1994 | Flamm | 156/345 X |
| 5,350,479 | 9/1994 | Collins et al. | 156/345 |

FOREIGN PATENT DOCUMENTS

| | | |
|---|---|---|
| 0271341A2 | 6/1988 | European Pat. Off. . |
| 0467046A3 | 1/1992 | European Pat. Off. . |
| 0467046A2 | 1/1992 | European Pat. Off. . |
| 4308088 | 10/1992 | Japan . |

OTHER PUBLICATIONS

Bhattacharya, "System for Varying the Directionality in Plasma Etching", IBM Technical Disclosure Bulletin, vol. 20, No. 3, Aug. 1977.

*Primary Examiner*—Thi Dang
*Attorney, Agent, or Firm*—Armstrong, Westerman, Hattori, McLeland & Naughton

[57] ABSTRACT

A plasma generating apparatus includes a vacuum chamber, an inductive-coupling coil wound around the vacuum chamber, a pair of parallel-planar electrodes, each of which electrode has a center on a central axis of the inductive-coupling coil within the vacuum chamber, and is disposed vertically against the central axis, a radio-frequency power supply, and a radio-frequency matching circuit coupled to the radio-frequency power supply. The radio-frequency matching circuit is coupled to at least one of the inductive-coupling coil and the pair of parallel-planar electrodes. The pair of parallel-planar electrodes and the inductive-coupling coil driven by the radio-frequency power supply carry out capacitive-coupling and inductive-coupling so as to be associated with each other, so that capacitively-coupled plasma and inductively-coupled plasma are generated within the vacuum chamber.

17 Claims, 4 Drawing Sheets

PLASMA GENERATING APPARATUS AND METHOD

BACKGROUND OF THE INVENTION

1. Field of the Invention

The present invention generally relates to a plasma generating apparatus and method, and more particularly, to a plasma generating apparatus and method which can be suitably applied to semiconductor process technologies.

In recent semiconductor process technologies using a plasma generator, there is a need for plasma etching under a high-vacuum condition, namely anisotropic etching capable of establishing a fine structure in semiconductor devices. However, as the degree of vacuum becomes higher, it becomes more difficult to generate high-density plasma. For generating a stable and high-density plasma, an auxiliary apparatus generating a magnetic field is required in addition to a plasma source. Such an additional apparatus may cause complexity of the plasma generator, and may increase the cost of the plasma generator. Thus, the semiconductor devices manufactured by using the above generator may be very expensive.

On the other hand, as a wafer size is increased, a larger volume of a plasma generator chamber is required. However, in such a large-volume chamber, power supplied to the plasma is dropped by reflection, etc., caused by the plasma generating process, whereby the plasma immediately dies out. Therefore, it is hard to generate uniform and stable, high-density plasma throughout the large volume of the chamber. Thus, it is desired to realize a superior plasma generator which can easily generate and maintain uniform and high-density plasma throughout the large volume of the chamber under the high-vacuum condition.

2. Description of the Prior Art

Conventionally, there are two major methods for plasma generation: 1) a capacitive-coupling method (RIE); and 2) an inductive-coupling method (ICP, etc.).

In the capacitive-coupling method, an electric field generated between electrodes enables superior uniformity of plasma density within a generator chamber. Thus, this method is suitable for anisotropic etching. However, in order to generate stable, high-density plasma under a high-vacuum condition with a larger-sized wafer and a larger-volume chamber, a significantly high voltage needs to be maintained across the electrodes. Therefore, dropping of power supplied to the plasma, which is caused by reflection, etc., during processing, causes the plasma to immediately die out. Thus, a high-power RF (radio frequency) power supply is required. To satisfy this requirement, heat sink control for external devices and reinforcement for generator construction are necessary, and thus the total cost of the plasma generator may increase.

On the other hand, the inductive-coupling method enables generation of relatively-high-density plasma. However, the power is supplied to the plasma from a coil (antenna) wound around the generator chamber, so that the plasma density in an outer part of the chamber is different from that in an inner part thereof and the generated plasma does not have a direction applicable to anisotropic etching. Therefore, another bias power supply, in addition to a power supply supplying the above-mentioned power to the plasma from the coil, is needed to obtain uniform plasma density throughout the large volume of the chamber and to orient the plasma stream in a desired direction. Furthermore, a control operation is needed to control phases of signals from the power supply for generating the plasma and the additional bias power supply. As a result, the above may cause controlling methods and configuration of the plasma generator to be complex, and thus a complicated operation on a variety of parameters is needed to supply stable plasma.

In the case of generating plasma by the capacitive-coupling method, the plasma thus generated has a good uniformity and is suitable for the anisotropic etching. However, when processing with a larger-sized wafer and a larger-volume chamber, there is a disadvantage in that it is difficult to generate and maintain stable, high-density plasma under the high-vacuum condition.

In the case of generating plasma by the inductive-coupling method, the plasma thus generated has an advantage of having a relatively high density. However, there are disadvantages in that the plasma is not uniform and the direction of the plasma stream is uncontrollable. Furthermore, in order to generate the plasma having both uniformity and direction throughout the large-volume chamber, it is necessary to install the coil and an external device such as the bias power supply.

SUMMARY OF THE INVENTION

It is an object of this invention to provide a plasma generating apparatus and method which generate and maintain high-density plasma with uniformity suitable for anisotropic etching under a high-vacuum condition, in which the disadvantages described above are eliminated.

A more specific object of the present invention is to simplify construction of the plasma generator and to reduce its cost and its power consumption.

The above objects are achieved by a plasma generating apparatus comprising a vacuum chamber, an inductive-coupling coil wound around said vacuum chamber, a pair of parallel-planar electrodes, each of which electrodes has a center on a central axis of said inductive-coupling coil within the vacuum chamber, and is disposed vertically against the central axis, a radio-frequency power supply, a radio-frequency matching circuit coupled to said radio-frequency power supply, wherein said radio-frequency matching circuit is coupled to at least one of the inductive-coupling coil and the pair of parallel-planar electrodes, said pair of parallel-planar electrodes and said inductive-coupling coil driven by the radio-frequency power supply carry out capacitive-coupling and inductive-coupling so as to be associated with each other, so that capacitively-coupled plasma and inductively-coupled plasma are generated within the vacuum chamber.

The objects described above are also achieved by a plasma generating method comprising a step of carrying out capacitive-coupling and inductive-coupling so as to be associated with each other by means of a pair of parallel-planar electrodes and an inductive-coupling coil, respectively, so that capacitively-coupled plasma and inductively-coupled plasma are generated within a vacuum chamber.

According to the plasma generating apparatus and method mentioned above, the pair of parallel-planar electrodes and the inductive-coupling coil carry out capacitive-coupling and inductive-coupling so as to be associated with each other, so that capacitively-coupled plasma and inductively-coupled plasma are generated within the vacuum chamber. In this operation, a magnetic field generated by the inductive-coupling coil and an electric field generated by the pair of parallel-planar electrodes are in the same position, and have the same operation cycle, so that energy streams into the plasma are always oriented to the same direction to supply stable plasma.

Thus, a plasma generator according to this invention, which has a simple configuration, can easily generate and maintain uniform and stable, high-density plasma throughout a large-volume chamber under a high-vacuum condition.

Other objects and further features of the present invention will be apparent from the following detailed description when read in conjunction with the accompanying drawings.

DESCRIPTION OF THE PREFERRED EMBODIMENTS

Figure 1:
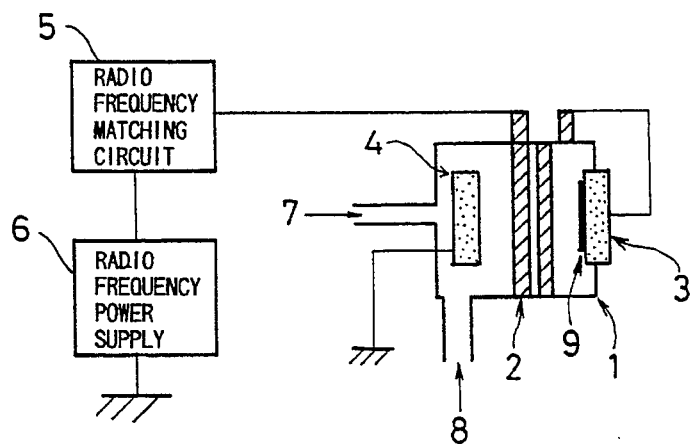
FIG. 1 is a block diagram showing a first embodiment of a plasma generator according to the present invention.

First, a description will be given of a first embodiment of a plasma generator according to the present invention, by referring to FIGS. 1 to 4. FIG. 1 shows a block diagram of the first embodiment, FIG. 2 shows a perspective illustration of an electrode part of the first embodiment, FIG. 3 shows a perspective illustration of the overall configuration of the first embodiment, and FIG. 4 shows an equivalent circuit of the first embodiment.

Figure 3:
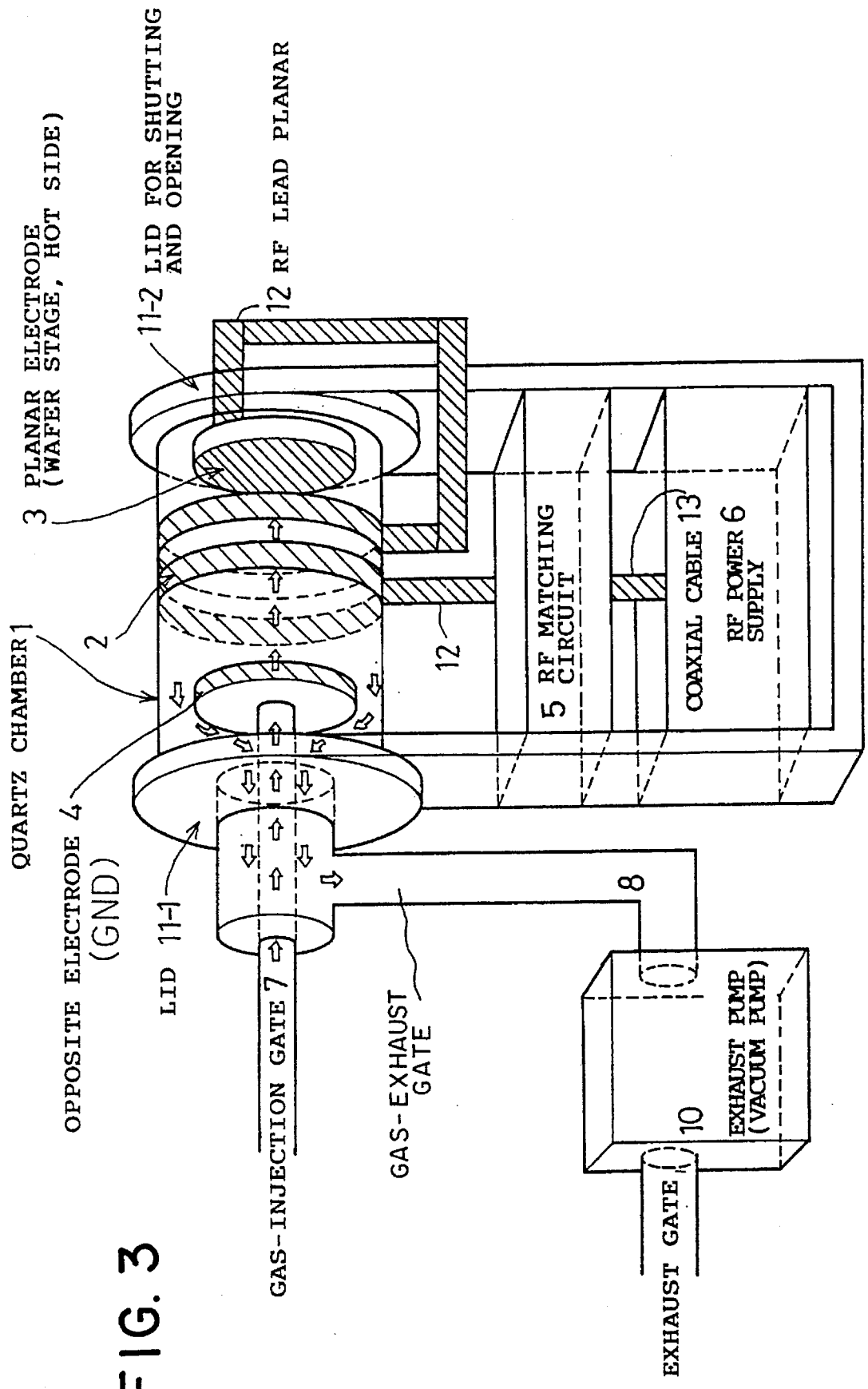
FIG. 3 is a perspective illustration showing the overall configuration of the first embodiment.
Figure 4:
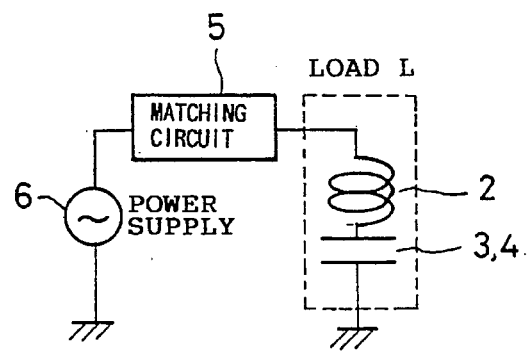
FIG. 4 is an equivalent circuit of the first embodiment.

As shown in FIG. 1 and FIG. 3, the plasma generator includes a vacuum chamber 1 constructed of cylindrical quartz, an inductive-coupling coil 2, a planar electrode 3, an opposite electrode 4, a radio-frequency matching circuit 5, a radio-frequency power supply 6, a gas-injection gate 7, and a gas-exhaust gate 8. The planar electrode 3 is installed for capacitive-coupling, uniform distribution of plasma, and adjustment of plasma stream direction.

Figure 2:
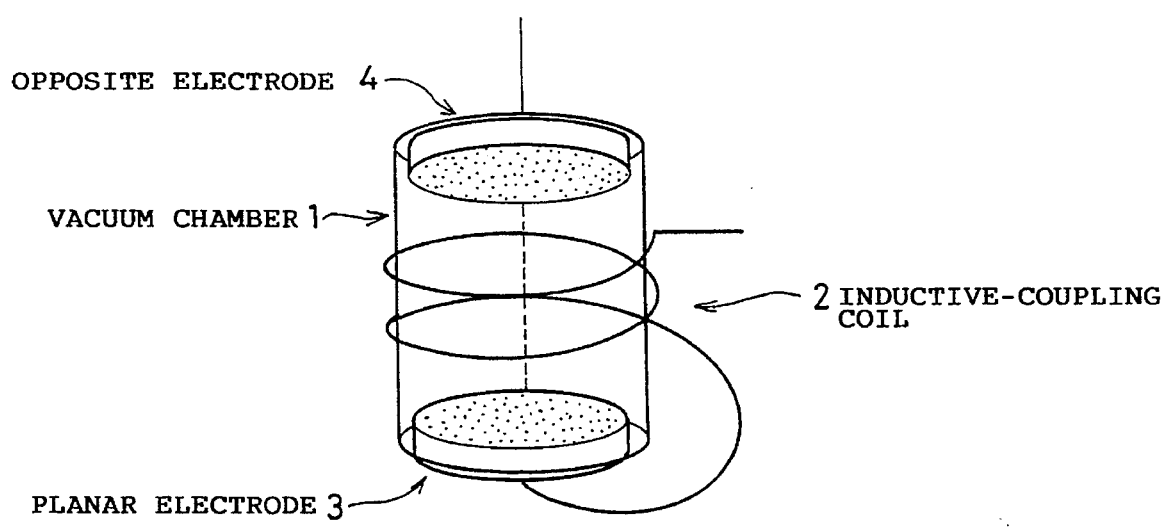
FIG. 2 is a perspective illustration showing an electrode part of the first embodiment.

As shown in FIG. 2, the opposite electrode 4 is disposed on the opposite side of the vacuum chamber 1 as the planar electrode 3, the inductive-coupling coil 2 is wound around the vacuum chamber 1. In other words, each electrode of the pair of parallel-planar electrodes 3, 4 has a center on a central axis of the inductive-coupling coil 2 within the vacuum chamber 1, and is disposed vertically against the central axis. As shown in FIG. 1, a wafer 9 for an etching process is positioned on the planar electrode 3, which is also used as a wafer stage in the vacuum chamber 1.

As shown in FIG. 3, the vacuum chamber 1 can be made airtight by shutting lids 11-1, 11-2. When opening the lid 11-2, the wafer 9 can be set on the planar electrode 3. Gases for processing are led to the vacuum chamber 1 through the gas-injection gate 7. The gas-exhaust gate 8 is connected to an exhaust pump (a vacuum pump) 10. The radio-frequency matching circuit 5 is coupled by way of an RF (radio frequency) planar lead 12 to the inductive-coupling coil 2, and the inductive-coupling coil 2 is coupled by way of the RF planar lead 12 to the planar electrode 3. The planar electrode 3 is insulated, and the opposite electrode 4 and the radio-frequency power supply 6 are grounded, respectively.

In this embodiment, the inductive-coupling coil 2, the planar electrode 3, and the opposite electrode 4 are coupled in series to the radio-frequency matching circuit 5. Therefore, an equivalent circuit of this embodiment is shown in FIG. 4. In this figure, the radio-frequency power supply 6, the radio-frequency matching circuit 5, and a load L encompassed by the block shown in dotted lines are coupled in series, where the load L includes the inductive-coupling coil 2, the planar electrode 3, and the opposite electrode 4. Series resonance on these elements enables supplying power to the plasma. Thus, capacitively-coupled plasma and inductively-coupled plasma are simultaneously generated, so that an etching process for the wafer 9 on the planar electrode 3 is carried out by the generated plasma.

In such configuration of a series coupling, impedance of the load L is decreased by the series resonance of the inductive-coupling coil 2, the planar electrode 3, and the opposite electrode 4. Therefore, an amount of current through the inductive-coupling coil 2 is increased, and a magnetic field across the inductive-coupling coil 2 becomes strong, thus the inductively-coupled plasma may be generated by the inductive-coupling coil 2.

At the same time, the capacitively-coupled plasma may be generated by the planar electrode 3 and the opposite electrode 4. In this plasma generating process, an electric field is generated along the central axis of the inductive-coupling coil 2, so that distribution of the inductively-coupled plasma may be uniform and directions of plasma streams may be adjusted to one desired direction.

Furthermore, the magnetic field generated by the inductive-coupling coil 2 and the electric field generated by the planar electrode 3 and the opposite electrode 4, are generated in the same position, and have the same operating cycle, so that energy streams into the plasma are always oriented to the same direction S to supply stable plasma. In this operation, an equation, $S=E \times H$, is obtainable, where S is Pointing vector representing the direction of the energy streams, H and E represent, respectively the magnetic field and the electric field mentioned above.

Figure 5:
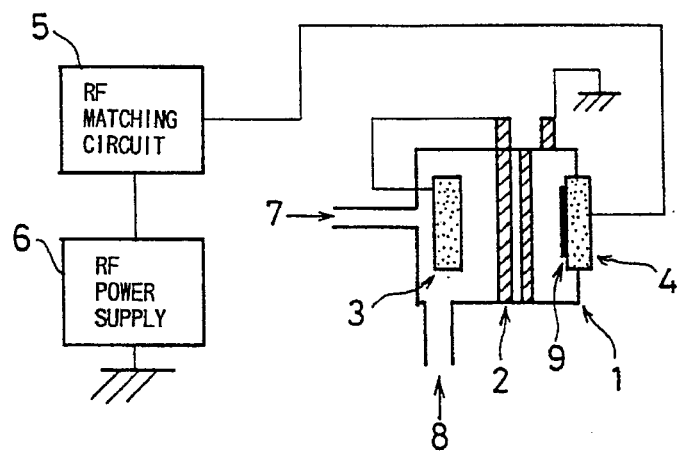
FIG. 5 is a block diagram showing a second embodiment of a plasma generator according to the present invention.
Figure 6:
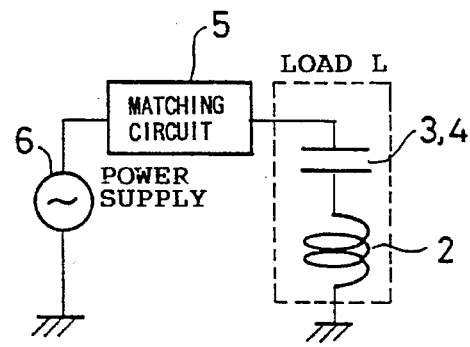
FIG. 6 is an equivalent circuit of the second embodiment.

Next, a description will be given of a second embodiment of the plasma generator according to the present invention, by referring to FIG. 5 and FIG. 6. FIG. 5 shows a block diagram of the second embodiment, and FIG. 6 shows an equivalent circuit of the second embodiment. In FIG. 5 and FIG. 6, those parts which are the same as those corresponding to parts in FIGS. 1 to 4 are designated by the same reference numerals, and a description thereof will be omitted.

In this embodiment shown in FIG. 5, the wafer 9 is positioned on the opposite electrode 4 which is also used as the wafer stage. In FIG. 5 and FIG. 6, the opposite electrode 4, the planar electrode 3, and the inductive-coupling coil 2 are coupled in series to the radio-frequency matching circuit 5 similarly to the first embodiment. However, in the second embodiment, an end of the inductive-coupling coil 2 is grounded and the opposite electrode 4 and the planar electrode 3 are insulated, respectively. In this operation, by the same operation principle as mentioned above in the first embodiment description, capacitively-coupled plasma and inductively-coupled plasma are simultaneously generated, so that an etching process for the wafer 9 on the opposite electrode 4 is carried out by the generated plasma.

Figure 7:
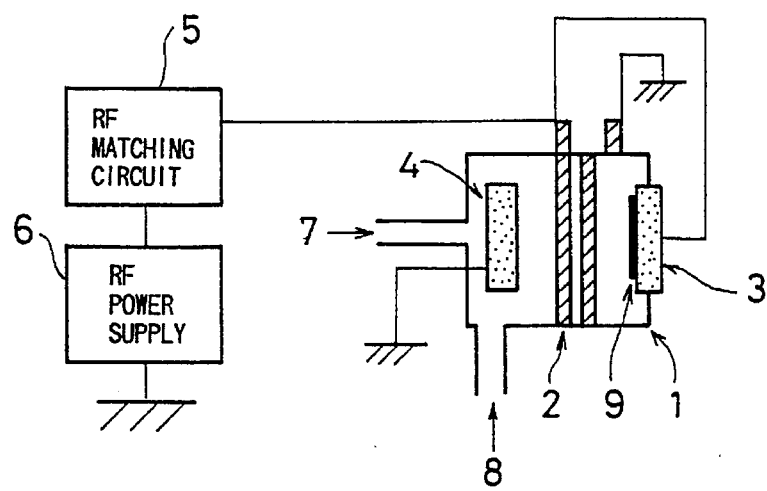
FIG. 7 is a block diagram of a third embodiment of a plasma generator according to the present invention.
Figure 8:
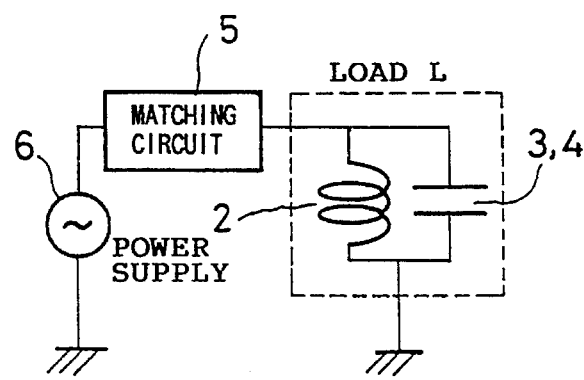
FIG. 8 is an equivalent circuit of the third embodiment.

Next, a description will be given of a third embodiment of the plasma generator according to the present invention, by referring to FIG. 7 and FIG. 8. FIG. 7 shows a block diagram of the third embodiment, and FIG. 8 shows an equivalent circuit of the third embodiment. In FIG. 7 and FIG. 8, those parts which are the same as those corresponding parts in FIGS. 1 to 4 are designated by the same reference numerals, and a description thereof will be omitted.

In this embodiment shown in FIG. 7 and FIG. 8, the pair of the planar electrode 3 and the opposite electrode 4, and the inductive-coupling coil 2 are coupled in parallel to the radio-frequency matching circuit 5, while an end of the inductive-coupling coil 2 and the opposite electrode 4 are grounded. In this operation, parallel resonance, which is caused between the planar and opposite electrodes 3, 4 and the inductive-coupling coil 2, enables supplying power to plasma. The power from either the inductive-coupling coil 2 or the planar electrode 3, may be supplied to the plasma with keeping balance of these two elements by the plasma itself. Thus, capacitively-coupled plasma and inductively-coupled plasma are simultaneously generated, and an etching process is carried out for the wafer 9 on the planar electrode 3.

By using the parallel coupling mentioned above, even though a large volume of the vacuum chamber 1 imposes a condition that it is hard to generate the capacitively-coupled plasma from the planar and the opposite electrodes 3, 4, the inductively-coupled plasma generated by the inductive-coupling coil 2 enables stable plasma generation from the planar electrode 3. Therefore, it is easy to generate and maintain the capacitively-coupled plasma with relatively-low power, and the above enables uniform distribution of the inductively-coupled plasma and adjustment of plasma stream direction.

Furthermore, in this embodiment, the planar electrode 3 is coupled in parallel to the inductive-coupling coil 2, so that the plasma itself can select a power supplying source. Similarly to using the series coupling, stable plasma is obtainable by orienting energy streams to the plasma in one direction.

In these embodiments mentioned above, a condition and characteristics of the plasma are controllable by way of winding for the inductive-coupling coil 2 such as a number of turns, clockwise or counter-clockwise.

According to the present invention, a pair of planar electrodes and an inductive-coupling coil simultaneously carry out capacitive-coupling and inductive-coupling, respectively, and generate capacitively-coupled plasma and inductively-coupled plasma within a vacuum chamber. Therefore, a magnetic field generated by the inductive-coupling coil and an electric field generated by the pair of the planar electrodes are in the same position, and have the same operation cycle. Furthermore, energy streams to the plasma are always oriented in one direction. Thus, even under a high-vacuum condition, it may be relatively easy to generate and maintain uniform, stable, and high-density plasma. In addition, power supply to the plasma (for generating and maintaining the plasma), uniformity and direction are controllable by one electrode, so that only one radio-frequency power supply is required for electrical control of the plasma such as control of a magnetic field and an electric field. As a result, complicated parameters and external devices are unnecessary, and a plasma generator can be constructed with low cost, and thus, great convenience.

Further, the present invention is not limited to these embodiments, but various variations and modifications may be made without departing from the scope of the present invention.

What is claimed is:

1. A plasma generating method comprising a step of carrying out capacitive-coupling and inductive-coupling so as to be associated with each other by means of a pair of parallel-planar electrodes and an inductive-coupling coil driven by a single radio-frequency power supply, respectively, so that capacitively-coupled plasma and inductively-coupled plasma are generated within a vacuum chamber.

2. The plasma generating method as claimed in claim 1, wherein a condition and characteristics of the generated plasma are controllable by way of a winding of the inductive-coupling coil.

3. The plasma generating method as claimed in claim 2, wherein a magnetic field generated by the inductive-coupling coil and an electric field generated by the pair of the parallel-planar electrodes are in a same position, and have a same operation cycle.

4. The plasma generating method as claimed in claim 1, wherein a magnetic field generated by the inductive-coupling coil and an electric field generated by the pair of the parallel-planar electrodes are in a same position, and have a same operation cycle.

5. The plasma generating method as claimed in claim 1, wherein said inductive-coupling coil and said pair of parallel-planar electrodes constructs a resonance circuit.

6. A plasma generating apparatus comprising:

a vacuum chamber;

an inductive-coupling coil wound around said vacuum chamber;

a pair of parallel-planar electrodes, each of which electrodes has a center on a central axis of said inductive-coupling coil within the vacuum chamber, and is disposed vertically against the central axis;

a radio-frequency power supply; and a radio-frequency matching circuit coupled to said radio-frequency power supply;

wherein:

said a radio-frequency matching circuit is coupled to said inductive-coupling coil and to said pair of parallel-planar electrodes;

said pair of parallel-planar electrodes and said inductive-coupling coil are driven by the radio-frequency power supply; and said pair of parallel-planar electrodes and said inductive-coupling coil driven by the radio-frequency power supply carry out capacitive-coupling and inductive-coupling so as to be associated with each other, so that capacitively-coupled plasma and inductively-coupled plasma are generated within the vacuum chamber.

7. The plasma generating apparatus as claimed in claim 1, wherein said inductive-coupling coil and said pair of parallel-planar electrodes constructs a resonance circuit.

8. A plasma generating apparatus comprising:

a vacuum chamber;

an inductive-coupling coil wound around said vacuum chamber;

a pair of parallel-planar electrodes, each of which electrodes has a center on a central axis of said inductive-coupling coil within the vacuum chamber, and is disposed vertically against the central axis;

a radio-frequency power supply; and a radio-frequency matching circuit coupled to said radio-frequency power supply;

wherein:

said a radio-frequency matching circuit is coupled to said inductive-coupling coil and to said pair of parallel-planar electrodes;

said pair of parallel-planar electrodes and said inductive-coupling coil are driven by the radio-frequency power supply; and said pair of parallel-planar electrodes and said inductive-coupling coil driven by the radio-frequency power supply carry out capacitive-coupling and inductive-coupling so as to be associated with each other, so that capacitively-coupled plasma and inductively-coupled plasma are generated within the vacuum chamber; and said pair of parallel-planar electrodes and said inductive-coupling coil are coupled in series to said radio-frequency matching circuit.

9. The plasma generating apparatus as claimed in claim 8, wherein:

said pair of parallel-planar electrodes includes first and second electrodes;

said first electrode and said radio-frequency power supply are grounded;

an end of said inductive-coupling coil is coupled to said radio-frequency matching circuit;

the other end of the coil is coupled to said second electrode; and a substrate for plasma processing is positioned on the second electrode.

10. The plasma generating apparatus as claimed in claim 8, wherein:

said pair of parallel-planar electrodes includes first and second electrodes;

said first electrode is coupled to said radio-frequency matching circuit;

said second electrode is coupled to an end of said inductive-coupling coil;

the other end of the coil and said radio-frequency power supply are grounded; and a substrate for plasma processing is positioned on the first electrode.

11. The plasma generating apparatus as claimed in claim 8, wherein a condition and characteristics of the generated plasma are controllable by way of a winding of the inductive-coupling coil.

12. A plasma generating apparatus comprising:

a vacuum chamber;

an inductive-coupling coil wound around said vacuum chamber;

a pair of parallel-planar electrodes, each of which electrodes has a center on a central axis of said inductive-coupling coil within the vacuum chamber, and is disposed vertically against the central axis;

a radio-frequency power supply; and a radio-frequency matching circuit coupled to said radio-frequency power supply;

wherein:

said a radio-frequency matching circuit is coupled to said inductive-coupling coil and to said pair of parallel-planar electrodes;

said pair of parallel-planar electrodes and said inductive-coupling coil are driven by the radio-frequency power supply; and said pair of parallel-planar electrodes and said inductive-coupling coil driven by the radio-frequency power supply carry out capacitive-coupling and inductive-coupling so as to be associated with each other, so that capacitively-coupled plasma and inductively-coupled plasma are generated within the vacuum chamber; and said pair of parallel-planar electrodes and said inductive-coupling coil are coupled in parallel to said radio-frequency matching circuit.

13. The plasma generating apparatus as claimed in claim 12, wherein:

said pair of parallel-planar electrodes includes first and second electrodes;

said first electrode, an end of said inductive-coupling coil, and said radio-frequency power supply are grounded;

the other end of said inductive-coupling coil is coupled to said radio-frequency matching circuit and to said second electrode; and a substrate for plasma processing is positioned on the second electrode.

14. The plasma generating apparatus as claimed in claim 12, wherein a condition and characteristics of the generated plasma are controllable by way of a winding of the inductive-coupling coil.

15. A plasma generating apparatus comprising:

a vacuum chamber;

a load circuit having an inductive-coupling coil and a pair of planar electrodes provided to said vacuum chamber; and single power supply means, coupled to said inductive-coupling coil and said pair of planar electrodes in said load circuit, for supplying a radio frequency power to said load circuit so that the inductive-coupling coil and the pair of planar electrodes carry out capacitive-coupling and inductive-coupling so as to be associated with each other, whereby inductively-coupled plasma and capacitively-coupled plasma are generated within the vacuum chamber.

16. The plasma generating apparatus as claimed in claim 15, wherein said inductive-coupling coil and said pair of parallel-planar electrodes constructs a resonance circuit.

17. A plasma generating apparatus comprising:

a vacuum chamber;

an inductive-coupling coil wound around said vacuum chamber;

a pair of parallel-planar electrodes, each of which electrodes has a center on a central axis of said inductive-coupling coil within the vacuum chamber, and is disposed vertically against the central axis;

a radio-frequency power supply; and a radio-frequency matching circuit coupled to said radio-frequency power supply;

wherein:

said a radio-frequency matching circuit is coupled to said inductive-coupling coil and to said pair of parallel-planar electrodes;

said pair of parallel-planar electrodes and said inductive-coupling coil are driven by the radio-frequency power supply; and said pair of parallel-planar electrodes and said inductive-coupling coil driven by the radio-frequency power supply carry out capacitive-coupling and inductive-coupling so as to be associated with each other, so that capacitively-coupled plasma and inductively-coupled plasma are generated within the vacuum chamber; and a condition and characteristics of the generated plasma are controllable by way of a winding of the inductive-coupling coil.

* * * * *